(12) United States Patent
Zhu et al.

(10) Patent No.: US 12,457,782 B1
(45) Date of Patent: Oct. 28, 2025

(54) GAN-BASED DEVICE BASED ON PATTERNED OHMIC CONTACT AND MANUFACTURING METHOD THEREOF

(71) Applicant: Xidian University, Xi'an (CN)

(72) Inventors: Jiejie Zhu, Xi'an (CN); Xiaohua Ma, Xi'an (CN); Jingshu Guo, Xi'an (CN)

(73) Assignee: Xidian University, Xi'an (CN)

( * ) Notice: Subject to any disclaimer, the term of this patent is extended or adjusted under 35 U.S.C. 154(b) by 0 days.

(21) Appl. No.: 19/257,402

(22) Filed: Jul. 1, 2025

Related U.S. Application Data

(63) Continuation of application No. PCT/CN2023/078195, filed on Feb. 24, 2023.

(51) Int. Cl.
| | |
|---|---|
| H10D 30/01 | (2025.01) |
| H01L 21/033 | (2006.01) |
| H10D 30/47 | (2025.01) |
| H10D 62/10 | (2025.01) |
| H10D 62/824 | (2025.01) |
| H10D 64/62 | (2025.01) |

(52) U.S. Cl.
CPC ....... *H10D 62/126* (2025.01); *H01L 21/0334* (2013.01); *H10D 30/015* (2025.01); *H10D 30/472* (2025.01); *H10D 30/475* (2025.01); *H10D 30/4755* (2025.01); *H10D 62/824* (2025.01); *H10D 64/62* (2025.01)

(58) Field of Classification Search
None
See application file for complete search history.

(56) References Cited

U.S. PATENT DOCUMENTS

| | | | |
|---|---|---|---|
| 2007/0132037 A1* | 6/2007 | Hoshi | H10D 30/015 |
| | | | 257/E29.253 |
| 2016/0172455 A1* | 6/2016 | Kikkawa | H10D 64/256 |
| | | | 438/172 |

(Continued)

FOREIGN PATENT DOCUMENTS

| | | |
|---|---|---|
| CN | 215933615 U | 3/2022 |
| CN | 114361030 A | 4/2022 |

OTHER PUBLICATIONS

Clams of PCT/CN2023/078195, Feb. 24, 2023.
ISA (CNIPA), Written opinion for PCT/CN2023/078195, Oct. 25, 2023.

*Primary Examiner* — Grant S Withers
(74) *Attorney, Agent, or Firm* — Hemisphere Law, PLLC; Zhigang Ma

(57) ABSTRACT

A GaN-based device based on patterned ohmic contact is provided, including: a substrate layer, a nucleation layer, a buffer layer, a channel layer, an insertion layer, a barrier layer and a cap layer sequentially disposed in that order from bottom to top. Two ends of the cap layer respectively define ohmic contact recesses extending into the channel layer. A side wall of each ohmic contact recess close to the gate electrode includes multiple arc-shaped side walls and multiple flat side walls. Two epitaxial layers are disposed in the ohmic contact recesses respectively. A passivation layer is covered on the cap layer and the two epitaxial layers, a source electrode and a drain electrode penetrate through the passivation layer and are disposed on the two epitaxial layers respectively. A gate electrode is located between the ohmic contact recesses, and penetrates through the passivation layer and extends to the cap layer.

4 Claims, 8 Drawing Sheets

(56) References Cited

U.S. PATENT DOCUMENTS

| | | | |
|---|---|---|---|
| 2022/0052166 A1* | 2/2022 | Yeh | H10D 64/256 |
| 2022/0246737 A1* | 8/2022 | Loghmany | H01L 23/4824 |
| 2022/0336600 A1* | 10/2022 | Liu | H10D 64/512 |
| 2023/0077826 A1* | 3/2023 | Cheng | H10D 30/475 |
| | | | 257/286 |
| 2023/0080538 A1* | 3/2023 | Cheng | H10D 30/015 |
| | | | 257/76 |

* cited by examiner

GAN-BASED DEVICE BASED ON PATTERNED OHMIC CONTACT AND MANUFACTURING METHOD THEREOF

CROSS-REFERENCE TO RELATED APPLICATION

This application is a continuation of International Patent Application No. PCT/CN 2023/078195, filed on Feb. 24, 2023, which is herein incorporated by reference in its entirety.

TECHNICAL FIELD

The disclosure relates to the technical field of semiconductors, and more particularly to a gallium nitride (GaN)-based device based on patterned ohmic contact and a manufacturing method thereof.

BACKGROUND

GaN shows great application potential in the fields of microwave, millimeter wave and terahertz amplifiers due to its excellent material properties, such as high mobility, high breakdown electric field and high electron saturation rate. Compared with the first generation of silicon devices and the second generation of gallium arsenide devices, GaN devices can achieve higher breakdown voltage, provide higher power density and higher peak efficiency, and have broad development prospects in satellite communications, drones, automotive radars, mobile communications and other fields. GaN materials and device processes continue to mature, in order to achieve higher spectral efficiency, higher data transmission rates and higher energy efficiency, technicians need to further improve the frequency, efficiency and other indicators of the device.

Reducing parasitic resistance is one of the main ways to improve device frequency characteristics and work efficiency. As the device size continues to shrink, the impact of device parasitic resistance, especially ohmic contact resistance, becomes increasingly apparent. Currently, the main methods for achieving ohmic contact are high-temperature alloyed ohmic contact, ion implanted ohmic contact, and regrown ohmic contact.

Specifically, the regrown ohmic contact has attracted wide attention since it can achieve extremely low contact resistance and high-quality graphics. The current ohmic regrowth technology mainly etches grooves extending to a channel region in a source electrode region and a drain electrode region, and then uses molecular beam epitaxy (MBE) or metal-organic chemical vapor deposition (MOCVD) to grow highly doped n-type doped gallium nitride ($n^+$-GaN) or n-type doped indium gallium nitride ($n^+$-InGaN) materials to achieve lower ohmic contact resistance. The contact resistance of the regrown ohmic contact mainly consists of the following three parts: a contact resistance between the metal and the $n^+$-GaN material (or $n^+$-InGaN material), a resistance of the regrown $n^+$-GaN material (or $n^+$-InGaN material), and a contact resistance between the $n^+$-GaN material (or $n^+$-InGaN material) and a GaN heterojunction channel. Current research shows that reducing the contact resistance between the $n^+$-GaN material (or $n^+$-InGaN material) and the GaN heterojunction channel is the key to achieving low-resistance ohmic contact. An effective contact area at an edge of the ohmic contact is limited, and how to further reduce the contact resistance has become an urgent problem to be solved.

SUMMARY

In order to solve the above problems in the related art, the disclosure provides a GaN-based device based on patterned ohmic contact and a manufacturing method thereof. The technical problems to be solved in the disclosure are achieved through the following technical solutions.

The first aspect of the embodiments of the disclosure provide a GaN-based device based on patterned ohmic contact, including a substrate layer, a nucleation layer, a buffer layer, a channel layer, an insertion layer, a barrier layer, a cap layer, ohmic contact recesses, a gate electrode, epitaxial layers, a passivation layer, a source electrode and a drain electrode. The substrate layer, the nucleation layer, the buffer layer, the channel layer, the insertion layer, the barrier layer, and the cap layer are sequentially disposed in that order from bottom to top. The ohmic contact recesses are defined on two ends of the cap layer respectively and extend into the channel layer, and a long axis of each ohmic contact recess extends along a gate width direction. The gate electrode is located between the ohmic contact recesses. A side wall of each ohmic contact recess close to the gate electrode includes multiple arc-shaped side walls and multiple flat side walls. The multiple arc-shaped side walls and the multiple flat side walls are alternately arranged and sequentially connected; and each arc-shaped side wall protrudes towards a direction of the gate electrode. The epitaxial layers are disposed in the ohmic contact recesses respectively, and an upper end of each of the epitaxial layers is located above the cap layer. The passivation layer is covered on the cap layer and the epitaxial layers, the source electrode and the drain electrode penetrate through the passivation layer and are disposed on the epitaxial layers respectively. The gate electrode penetrates through the passivation layer and extends onto the cap layer. The epitaxial layers are made from a $n^+$-GaN material or a $n^+$-InGaN material.

In an embodiment of the disclosure, the nucleation layer and the insertion layer are made from aluminum nitride (AlN) material. The buffer layer, the channel layer and the cap layer are made from GaN material. The barrier layer is made from indium aluminum nitride (InAlN) material.

The second aspect of the embodiments of the disclosure provide a manufacturing method of a GaN-based device based on patterned ohmic contact, including:

step 1, growing the nucleation layer, the buffer layer, the channel layer, the insertion layer, the barrier layer and the cap layer on the substrate layer sequentially in that order;

step 2, growing a silicon oxide ($SiO_2$) mask layer on the cap layer;

step 3, coating photoresist on the $SiO_2$ mask layer, and photolithographing ohmic contact region patterns on two sides of the photoresist;

where a long axis of each ohmic contact region pattern extends along the gate width direction, and opposite edges of the ohmic contact region patterns each include multiple arc-shaped edges and multiple flat edges; and where the multiple arc-shaped edges and the multiple flat edges are alternately arranged and sequentially connected; and each arc-shaped edge protrudes towards outward;

step 4, etching the $SiO_2$ mask layer, the cap layer, the barrier layer, the insertion layer and a part of the channel layer corresponding to the ohmic contact region patterns to form the ohmic contact recesses, and removing the photoresist;

step 5, epitaxially growing the n⁺-GaN material or the n⁺-InGaN material on a surface of a product prepared in the step 4;

step 6, removing the SiO₂ mask layer to form the epitaxial layers;

step 7, preparing the source electrode and the drain electrode on the epitaxial layers;

step 8, preparing a mesa isolation;

step 9, depositing the passivation layer on surfaces of the epitaxial layers and the cap layer, removing the passivation layer deposited on the source electrode and the drain electrode, and preparing a gate groove;

step 10, preparing the gate electrode; and step 11, performing metal interconnect to obtain the GaN-based device based on patterned ohmic contact as described in the first aspect of the embodiments of the disclosure.

In an embodiment of the disclosure, the step 3 includes: coating the photoresist on the SiO₂ mask layer, exposing to obtain exposed ohmic contact region patterns, and developing the exposed ohmic contact region patterns the ohmic contact region patterns on the two sides of the photoresist through a mask using a photolithography machine, to remove the photoresist on the ohmic contact region patterns.

In an embodiment of the disclosure, the step 4 includes: step 41, removing the SiO₂ mask layer on the ohmic contact region patterns, and etching to remove the cap layer, the barrier layer, the insertion layer and the part of the channel layer corresponding to the ohmic contact region patterns, to define the ohmic contact recesses; and step 42, removing the photoresist from a surface of a product prepared in the step 41.

In an embodiment of the disclosure, the step 7 includes: step 71, photolithographing a source electrode pattern and a drain electrode pattern on the epitaxial layers respectively;

step 72, evaporating titanium/gold (Ti/Au) metal electrodes through an electron beam evaporation device; and step 73, stripping metals in unexposed regions to form the source electrode and the drain electrode.

The beneficial effects of the disclosure are as follows.

The disclosure forms arcs on edges of the ohmic contact, which has a larger contact area, can effectively reduce an absolute contact resistance of the device, form a better ohmic contact, and minimize high electric field and current concentration around the contact part. Meanwhile, the contact parts between the arc-shaped contact parts are flat contact parts, so that a certain electric field peak can be formed, which can further reduce the contact resistance, avoid affecting source-drain breakdown characteristics of the device, thereby improving the stability of the device, and improving the performance of the millimeter wave power device. The manufacturing method of the disclosure is simple in process and saves costs.

The disclosure will be further described in detail in conjunction with drawings and embodiments.

DETAILED DESCRIPTION OF EMBODIMENTS

The disclosure is further described in detail in conjunction with embodiments, but the disclosure is not limited by this.

Embodiment 1

Figure 1:
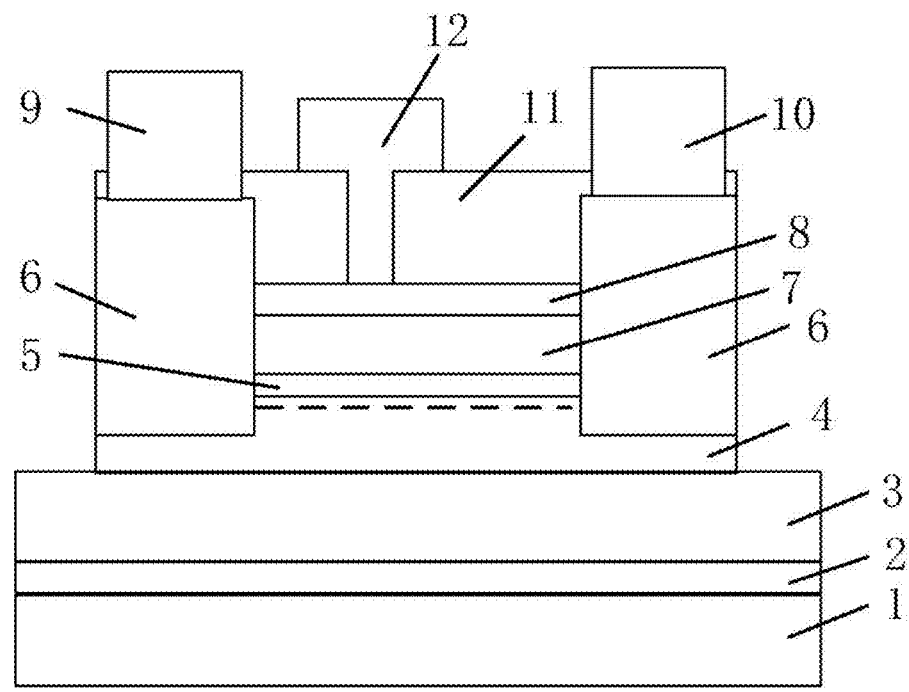
FIG. 1 illustrates a schematic sectional structural diagram of a GaN-based device based on patterned ohmic contact according to an embodiment of the disclosure.
Figure 2:
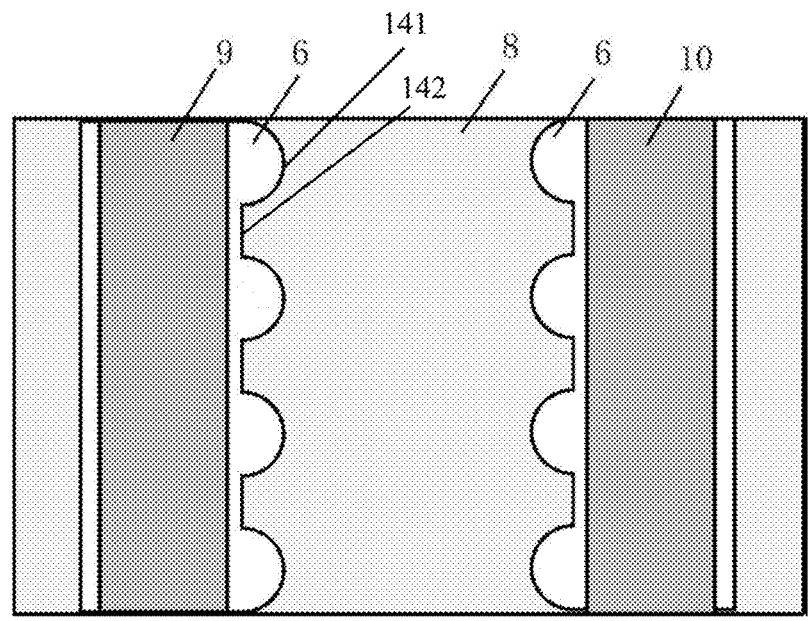
FIG. 2 illustrates a schematic diagram from a perspective of a top view of a device after manufacturing a source electrode and a drain electrode according to an embodiment of the disclosure.

As shown in FIG. 1 and FIG. 2, the first aspect of the embodiments of the disclosure provide a GaN-based device based on patterned ohmic contact, including a substrate layer 1, a nucleation layer 2, a buffer layer 3, a channel layer 4, an insertion layer 5, a barrier layer 7 and a cap layer 8 sequentially disposed in that order from bottom to top.

Two ends of the cap layer 8 respectively define ohmic contact recesses 14 extending into the channel layer 4. A long axis of each ohmic contact recess 14 extends along a gate width direction. A gate electrode 12 is located between the ohmic contact recesses 14. A side wall of each ohmic contact recess 14 close to the gate electrode 12 includes multiple arc-shaped side walls 141 and multiple flat side walls 142. The multiple arc-shaped side walls 141 and the multiple flat side walls 142 are alternately arranged and sequentially connected; and each arc-shaped side wall 141 protrudes towards a direction of the gate electrode 12. Epitaxial layers 6 are disposed in the ohmic contact recesses 14 respectively, and an upper end of each epitaxial layer 6 is located above the cap layer 8.

A passivation layer 11 is covered on the cap layer 8 and the epitaxial layers 6, a source electrode 9 and a drain electrode 10 penetrate through the passivation layer 11 and are disposed on the epitaxial layers 6 respectively. The gate electrode 12 penetrates through the passivation layer 11 and extends onto the cap layer 8. The epitaxial layers 6 are made from a n⁺-GaN material or a n⁺-InGaN material.

In the embodiment, the gate electrode 12 is a T-type, a horizontal section of the gate electrode 12 is located on a surface of the passivation layer 11, and a vertical section of the gate electrode 12 penetrates through the passivation layer 11 and extends onto the cap layer 8. A mesa isolation is formed from the channel layer 4 upwards.

In the embodiment, the nucleation layer 2 and the insertion layer 5 are made from AlN material. The buffer layer 3, the channel layer 4 and the cap layer 8 are made from GaN material. The barrier layer 7 is made from InAlN material.

The disclosure forms arcs on edges of the ohmic contact, which has a larger contact area, can effectively reduce an absolute contact resistance of the device, form a better ohmic contact, and minimize high electric field and current concentration around the contact part. Meanwhile, the contact parts between the arc-shaped contact parts are flat contact parts, so that a certain electric field peak can be formed, which can further reduce the contact resistance, and a spacing between the two opposite flat contact parts at two ends is smaller than a spacing between the two opposite arc-shaped contact parts. A highest point of the electric field of the device will not be formed at a connection between the arc-shaped contact parts and the flat contact parts, which avoids affecting source-drain breakdown characteristics of the device, thereby improving the stability of the device, and improving the performance of the millimeter wave power device.

Embodiment 2

The second aspect of the embodiments of the disclosure provide a manufacturing method of a GaN-based device based on patterned ohmic contact, to manufacture the device of the embodiment 1. The manufacturing method includes the following steps 1-11.

In step 1, the nucleation layer 2, the buffer layer 3, the channel layer 4, the insertion layer 5, the barrier layer 7 and the cap layer 8 are grown on the substrate layer 1 sequentially in that order.

Figure 3A:
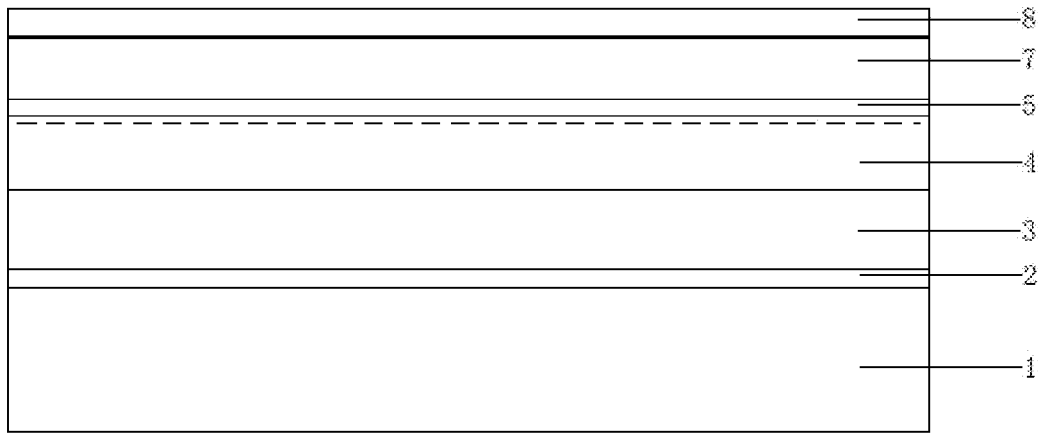
FIGS. 3A-3L illustrate a schematic diagram of a manufacturing process of the GaN-based device based on patterned ohmic contact according to an embodiment of the disclosure.

Specifically, as shown in FIG. 3A, on a sapphire substrate, a MOCVD process is used to sequentially grow an AlN nucleation layer 2, a GaN buffer layer 3, a GaN channel layer 4, an AlN insertion layer 5, an InAlN barrier layer 7 and a GaN cap layer 8.

In step 2, a $SiO_2$ mask layer 13 is grown on the cap layer 8.

Figure 3B:
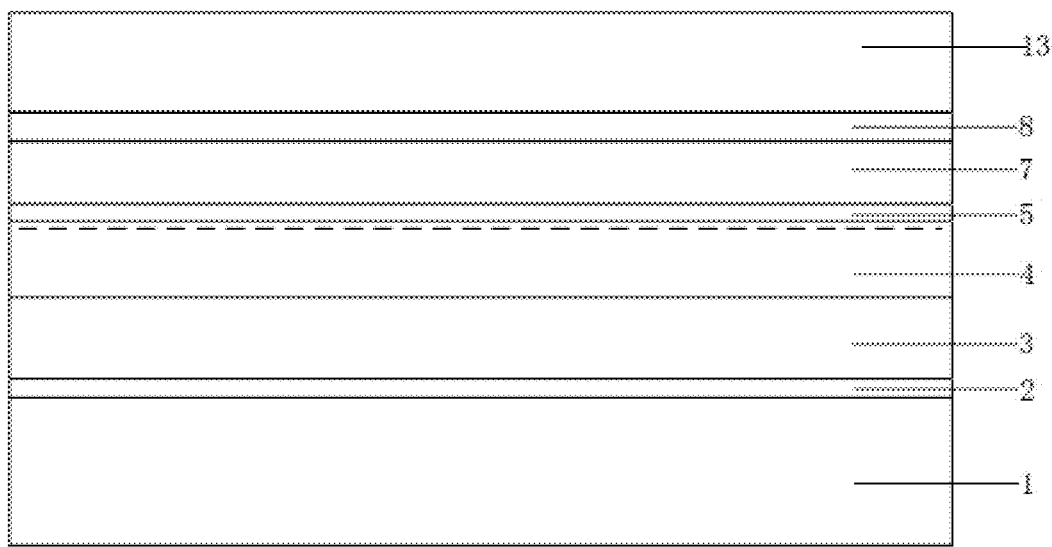

Specifically, as shown in FIG. 3B, a $SiO_2$ mask is deposited on the GaN cap layer 8 by using plasma enhanced chemical vapor deposition (PECVD), silane ($SiH_4$) and nitrogen dioxide ($NO_2$) are used as precursors, and $SiO_2$ is deposited at a furnace temperature of 300 Celsius degrees (° C.) as a regrown mask layer 13.

In step 3, photoresist is coated on the $SiO_2$ mask layer 13, and ohmic contact region patterns 15 are photolithographed on two sides of the photoresist.

Specifically, the photoresist is coated on the $SiO_2$ mask layer 13, a photolithography machine is used to expose and develop the ohmic contact region patterns 15 on two sides, to remove the photoresist on the ohmic contact region patterns 15.

Figure 3C:
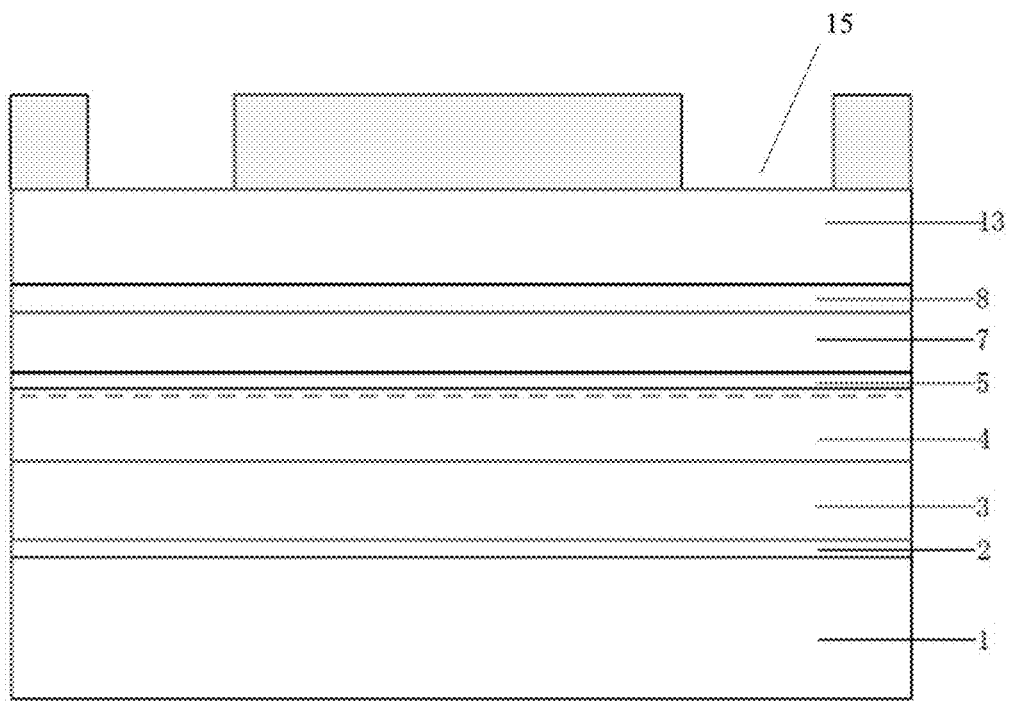

Specifically, the photoresist is coated on the $SiO_2$ mask layer 13 with a thickness of 1.2 microns (μm) and a soft backing time of 1 minute (min). The photolithography machine is used to expose a source pattern region and a drain pattern region (i.e., the ohmic contact region patterns 15) through the mask. After the exposure is completed, post-baking is performed on the exposed product for 1 min. After the post-baking is completed, a temperature of the product after post-baking is lowered to the room temperature and then developed to remove the photoresist in the pattern regions (i.e., the exposed source pattern region and the exposed source pattern region), and the photolithography is completed, as shown in FIG. 3C.

A long axis of each ohmic contact region pattern extends along the gate width direction, and opposite edges of the ohmic contact region patterns 15 each include multiple arc-shaped edges 151 and multiple flat edges 152. The multiple arc-shaped edges 151 and the multiple flat edges 152 are alternately arranged and sequentially connected; and each arc-shaped edge 151 protrudes towards outward.

In step 4, the $SiO_2$ mask layer 13, the cap layer 8, the barrier layer 7, the insertion layer 5 and a part of the channel layer 4 corresponding to the ohmic contact region patterns 15 are etched to form the ohmic contact recesses 14, and then the photoresist is removed.

Specifically, the step 4 includes the following steps 41-42.

In step 41, the $SiO_2$ mask layer 13 on the ohmic contact region patterns 15 is removed, and the cap layer 8, the barrier layer 7, the insertion layer 5 and the part of the channel layer 4 corresponding to the ohmic contact region patterns 15 are etched away, to define the ohmic contact recesses 14.

Figure 3D:
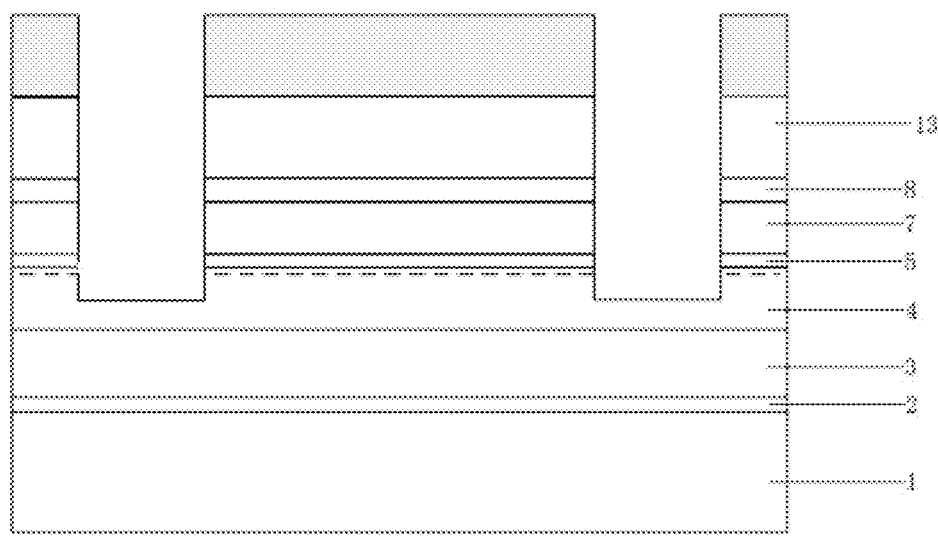

Specifically, dry-etching is performed on the product obtained in the step 3. The product is baked at 100° C. for 1 min by using a hot plate before etching, to enhance etching resistance of the photoresist. A fluorine (F)-based dry etching process is performed through an inductively coupled plasma (ICP) etching process, to remove the $SiO_2$ mask exposed after the photolithographing. A chlorine (Cl)-based etching is used to remove the GaN cap layer 8, the InAlN barrier layer 7, the AlN insertion layer 5, and the part of the GaN channel layer 4 under $SiO_2$ through the ICP etching process, and an etching depth is 45 nanometers (nm), as shown in FIG. 3D.

Figure 3E:
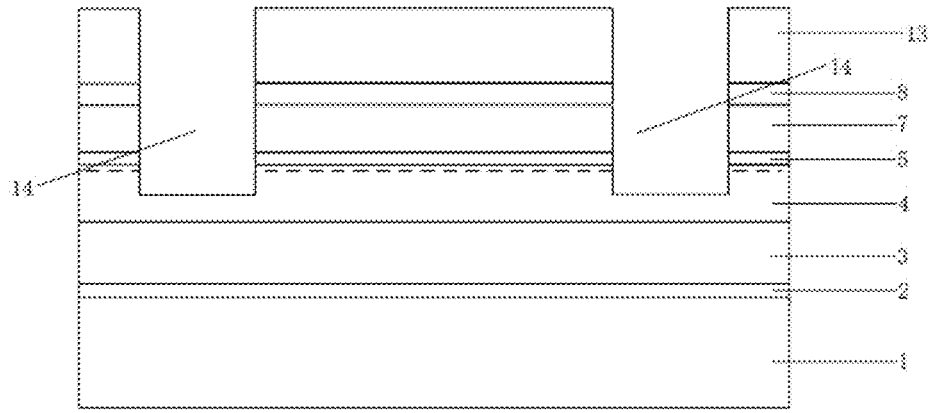
Figure 4:
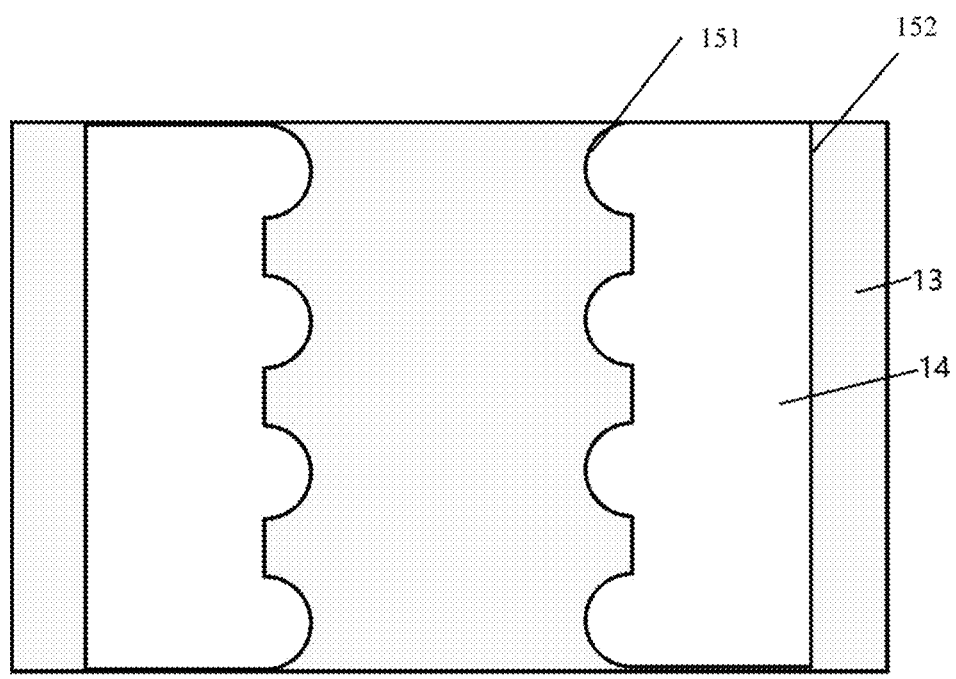
FIG. 4 illustrates a schematic diagram from a perspective of a top view of FIG. 3E.

In step 42, the photoresist is removed from a surface of a product prepared in the step 41. The product prepared in the step 41 is sequentially placed into acetone and isopropanol for ultrasonic cleaning, to remove the photoresist from the surface, followed by washed with ultrapure water and blown, as shown in FIG. 3E and FIG. 4.

In step 5, the $n^+$-GaN material or the $n^+$-InGaN material are epitaxially grown on the surface of the product prepared in step 4.

Figure 3F:
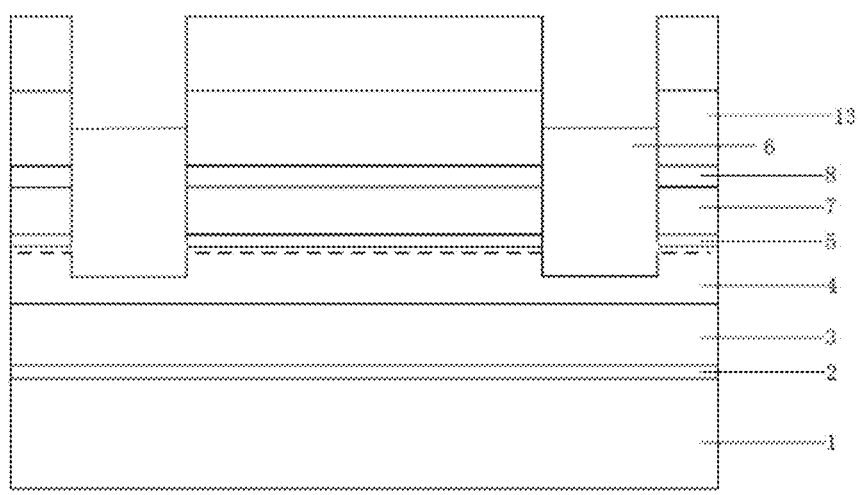

In the step, when epitaxially growing the $n^+$-GaN material, the $n^+$-GaN material is silicon (Si) doped material with a doping concentration of $1 \times 10^{20}$ per cubic centimeters ($cm^{-3}$), a growing temperature of 600° C., and a growing thickness of 80 nm, as shown in FIG. 3F.

Specifically, pre-epitaxy wet processing can be performed before epitaxially growing the $n^+$-GaN material or the $n^+$-InGaN material. Specifically, the product is heated in a water bath in 55° C. ammonia water at for 5 min. After heating is completed, the heated product is washed with ultrapure water and blown with nitrogen.

Figure 3G:
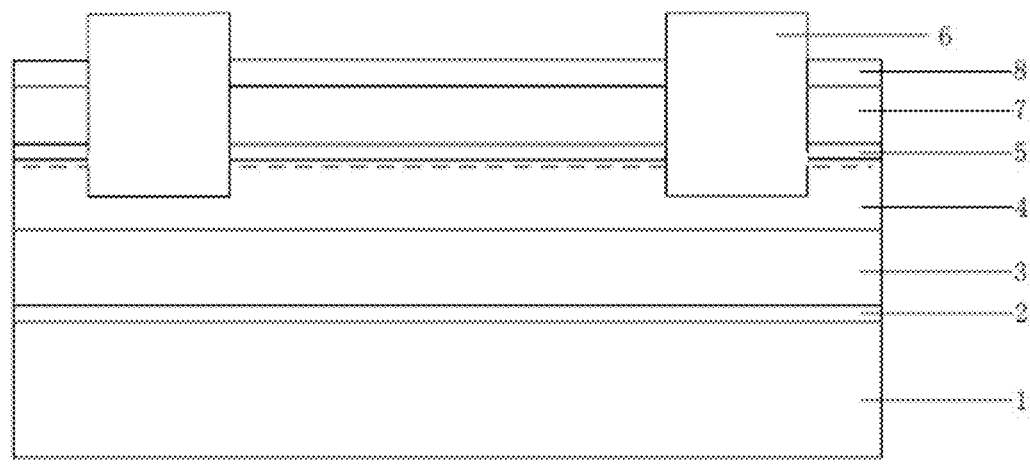

In step 6, the $SiO_2$ mask layer 13 is removed to form the epitaxial layers 6, as shown in FIG. 3G. Specifically, a sample of the product prepared in the step 5 is soaked in a hydrofluoric acid (HF) solution (HF: $H_2O$=2:3) for 15 min, so that the $SiO_2$ mask layer 13 is completely corroded, and then the product is washed with the ultrapure water for 2 min and blown with nitrogen. Polycrystalline GaN remaining on the upper layer is removed by mechanical stripping. The product is sequentially placed in acetone, stripping solution, acetone, and isopropanol for ultrasonic cleaning, followed by washed with ultrapure water and blown.

In step 7, the source electrode 9 and the drain electrode 10 are prepared on the epitaxial layers 6.

Specifically, the step 7 includes the following steps 71-73.

In step 71, a source electrode pattern and a drain electrode pattern are photolithographed on the epitaxial layers 6 respectively.

Specifically, double-layer photoresist is coated on the surface of the product prepared in the step 6, a thickness of a stripping glue on a bottom layer of the double-layer photoresist is about 0.35 μm, and a thickness of the photoresist on a top layer of the double-layer photoresist is about 0.56 μm. A source electrode pattern region and a drain electrode pattern are exposed. After exposure, post-baking is performed on the exposed product for 1 min. After post-baking is completed, a temperature of the product after post-baking is lowered to the room temperature, and then developed to remove the photoresist on the pattern regions, and the photolithography is completed.

In step 72, Ti/Au metal electrodes are evaporated through an electron beam evaporation device.

Specifically, the photoresist remined on the exposed regions is removed through a plasma glue remover, and Ti with a thickness of 20 nm and Au with a thickness of 200 nm are evaporated in sequence through electron beams.

Figure 3H:
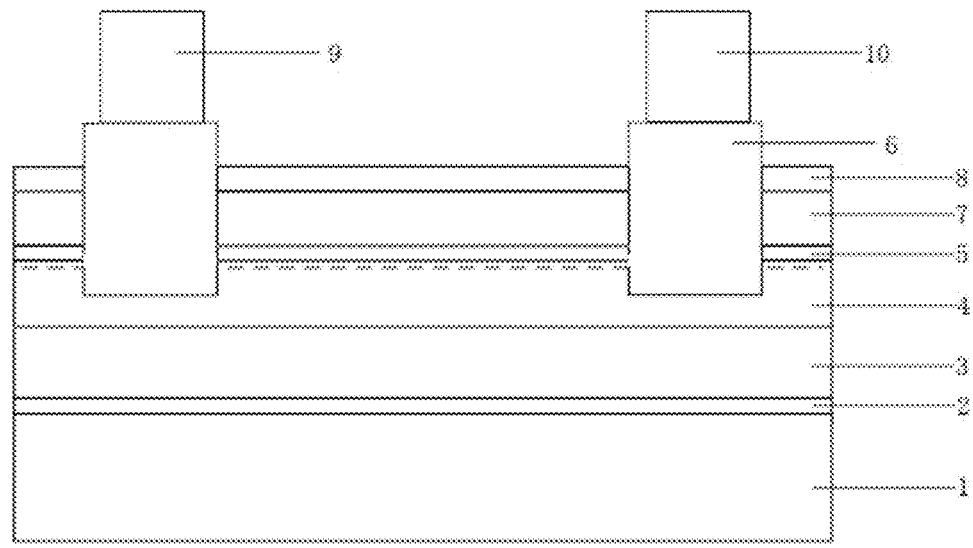

In step 73, metals in unexposed regions are stripped to form the source electrode 9 and the drain electrode 10, as shown in FIG. 3H.

Specifically, the product after metal evaporating is soaked in acetone for more than 3 hours (h), then ultrasonic is performed on the soaked product until the metals in the unexposed regions are completely removed. The sample of the product is placed into a stripping solution with a temperature of 60° C. for heating in a water bath for 15 min. Finally, the heated product is sequentially placed into acetone and isopropanol for ultrasonic cleaning for 3 min, followed by washed with ultrapure water for 2 min and blown with nitrogen.

Figure 3I:
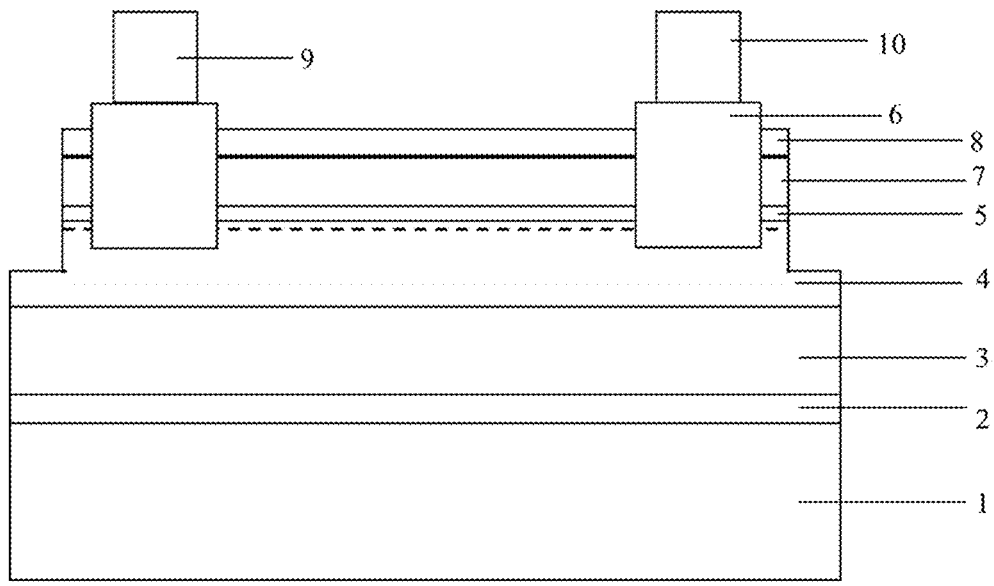

In step 8, a mesa isolation is prepared, as shown in FIG. 3I.

Specifically, the step 8 includes the following steps 81-83.

In step 81, a mesa isolation pattern is photolithographed.

A surface of the product prepared in the step 7 is coated with a single-layer anti-etching glue with a thickness of 0.78 µm, and a passive region is exposed through the mask using the photolithography machine. After the exposure is completed, post-baking is performed on the exposed product for 1 min. After the post-baking is completed, a temperature of the product after post-baking is lowered to the room temperature and then developed to remove the photoresist on the surface of the passive region, then the photolithography is completed.

In step 82, dry-etching is performed.

The product prepared in the step 81 is baked at 100° C. for 1 min by using the hot plate before etching, to enhance etching resistance of the photoresist. The dry-etching is performed through the ICP etching process, to remove the GaN cap layer 8, the InAlN barrier layer 7, the AlN insertion layer 5, and the GaN channel layer 4 on the surface of the passive region, and an etching depth is 150 nm.

In step 83, the photoresist after etching is removed.

The product prepared in the step 82 is sequentially placed in acetone, stripping solution, acetone, and isopropanol for ultrasonic cleaning to remove the photoresist on the surface, followed by washed with ultrapure water and blown.

Figure 3J:
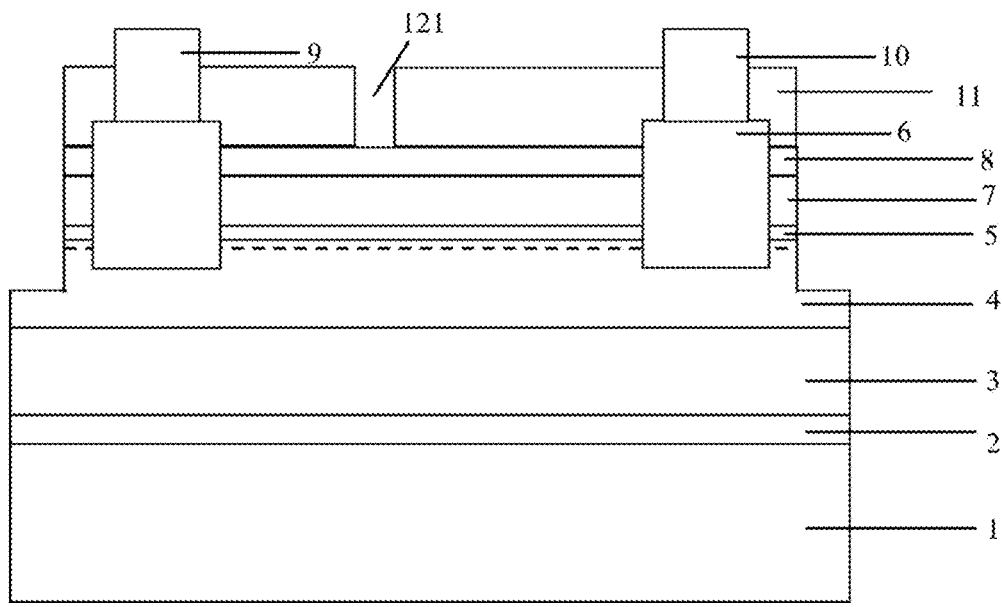

In step 9, the passivation layer 11 is deposited on surfaces of the epitaxial layer 6 and the cap layer 8, the passivation layer 11 deposited on the source electrode 9 and the drain electrode 10 is removed, and a gate groove 121 is defined, as shown in FIG. 3J.

Specifically, the step 9 includes the following steps 91-97.

In step 91, silicon nitride (SiN) is deposited by using PECVD as the passivation layer 11. $SiH_4$ and ammonium ($NH_4$) are used as precursors, and SiN with a thickness of 120 nm is deposited.

In step 92, through-hole patterns on surfaces of the source electrode 9 and the drain electrode 10 are photolithographed.

The single-layer anti-etching glue with a thickness of 0.78 µm is coated on the surface of the product prepared in the step 91, and the surfaces of the source electrode 9 and the drain electrode 10 are exposed. After the exposure is completed, post-baking is performed on the exposed product. After the post-baking is completed, a temperature of the product after post-baking is lowered to the room temperature and then developed to remove the photoresist on the surface of the metal electrodes, and then the photolithography is completed.

In step 93, the dry-etching is performed.

The product prepared in the step 92 is baked at 100° C. for 1 min by using the hot plate before etching, to enhance etching resistance of the photoresist. The dry-etching is performed through the ICP etching process, to remove the SiN passivation layer on the surfaces of the metal electrodes.

In step 94, the photoresist after etching is removed.

The product prepared in the step 93 is sequentially placed in acetone, stripping solution, and isopropanol for ultrasonic cleaning to remove the photoresist on the surface, followed by washed with ultrapure water and blown.

In step 95, a gate groove pattern is photolithographed on the SiN passivation layer 11.

The single-layer anti-etching glue with a thickness of 0.78 µm is coated on the surface of the product prepared in the step 94, and the surface of the photoresist on the gate groove pattern is exposed through the mask using the photolithography machine. After the exposure is completed, post-baking is performed on the exposed product. After the post-baking is completed, a temperature of the product after post-baking is lowered to the room temperature and then developed to remove the photoresist on the gate groove pattern, and then the photolithography is completed.

In step 96, the gate groove region is etched on the SiN passivation layer 11.

The product after completing the photolithography of the gate groove pattern is etched by using the ICP etching process with an etching gas of sulfur hexafluoride/carbon tetrafluoride ($SF_6/CF_4$), to etch SiN to the GaN cap layer 8, to thereby form the gate groove 121.

In step 97, the mask after etching is removed.

The product after completing the photolithography of the gate groove region is sequentially placed in acetone, stripping solution, acetone, and ethanol for cleaning to remove the photoresist outside the etching region, followed by washed with ultrapure water and blown.

Figure 3K:
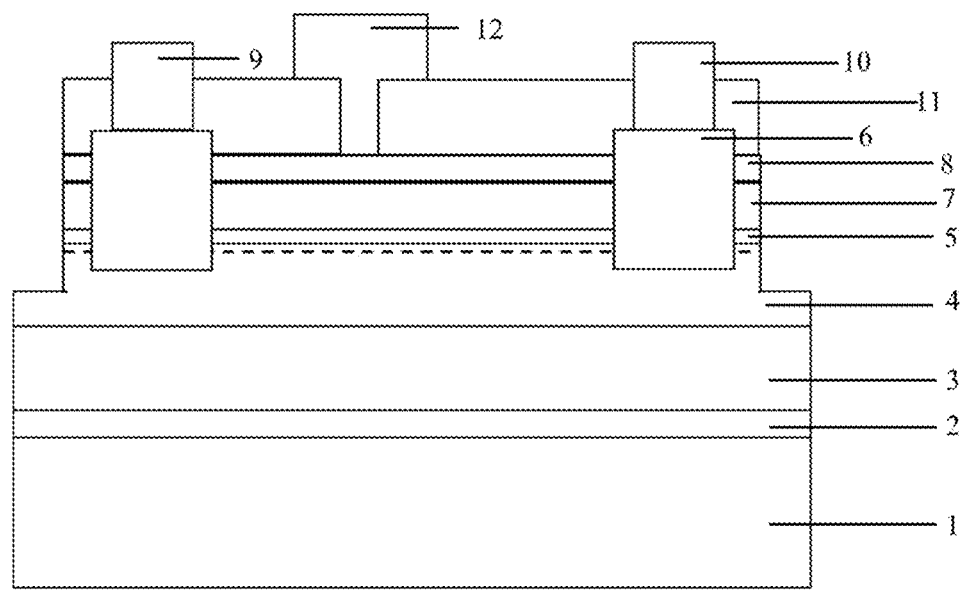

In step 10, the gate electrode 12 is prepared, as shown in FIG. 3K.

Specifically, the step 10 includes the following steps 101-103.

In step 101, a gate electrode pattern is photolithographed.

The double-layer photoresist is coated on the surface of the product prepared in the step 9, the thickness of the stripping glue on the bottom layer of the double-layer photoresist is about 0.35 µm, and the thickness of the photoresist on the top layer of the double-layer photoresist is about 0.56 µm. A gate electrode pattern region is exposed through the mask using the photolithography machine. After exposure is completed, post-baking is performed on the exposed product. After post-baking is completed, and a temperature of the product after post-baking is lowered to the room temperature, and then developed to remove the photoresist on the gate electrode pattern region, and then the photolithography is completed.

In step 102, nickel/gold (Ni/Au) metal electrode is evaporated through the electron beam evaporation device.

The photoresist remined on the exposed regions is removed through the plasma glue remover, and Ni with a thickness of 45 nm and Au with a thickness of 200 nm are evaporated in sequence through electron beams.

In step 103, the metal is stripped.

The product after metal evaporating is soaked in acetone for more than 3 h, then ultrasonic is performed on the soaked product until the metal in the unexposed region is completely removed. The product is placed into a stripping solution with a temperature of 60° C. for heating in a water bath for 15 min. Finally, the product is sequentially placed into acetone and isopropanol for ultrasonic cleaning for 3 min, followed by washed with ultrapure water for 2 min and blown with nitrogen.

Figure 3L:
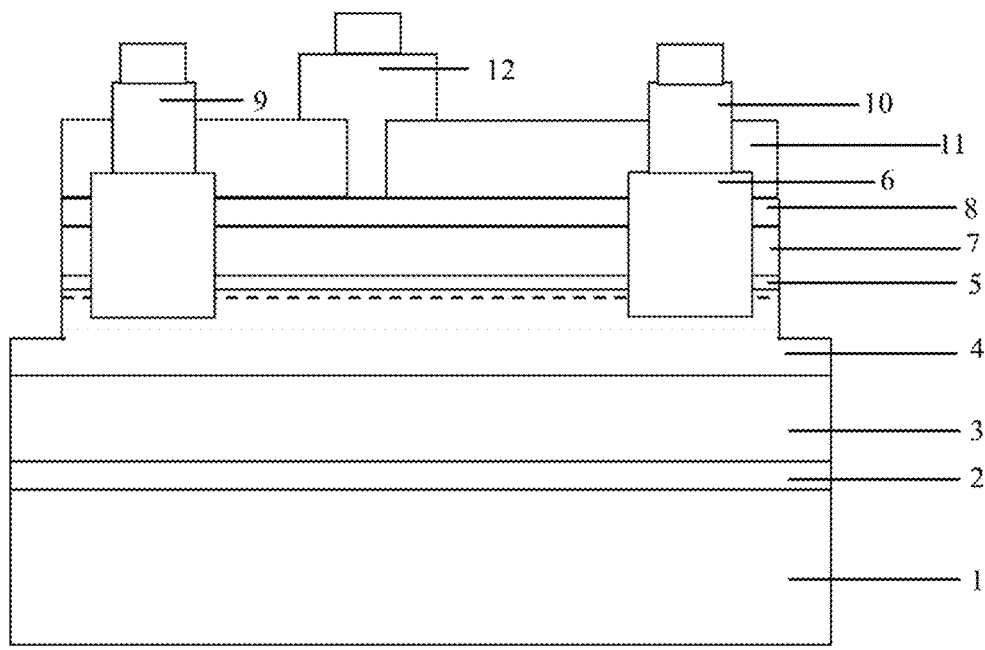

In step 11, metal interconnect is performed to obtain the device obtained in the embodiment 1, as shown in FIG. 3L.

Specifically, the step 11 includes the following steps 111-113.

In step 111, an interconnect pattern is photolithographed.

The photoresist is coated on the product prepared in the step 10, and the metal electrode regions are exposed through the mask using the photolithography machine. After exposure is completed, post-baking is performed on the exposed product. After post-baking is completed, and a temperature of the product is lowered to the room temperature, and then developed to remove the photoresist on the exposed region, and then the photolithography is completed.

In step 112, Ti/Au metal electrodes are evaporated through the electron beam evaporation device.

The photoresist remined on the exposed regions is removed through the plasma glue remover, and Ti with a thickness of 45 nm and Au with a thickness of 200 nm are evaporated in sequence through electron beams.

In step 113, the product after metal evaporating is soaked in acetone for more than 3 h, then ultrasonic is performed on the soaked product until the metals in the unexposed regions are completely removed. The product is placed into a stripping solution with a temperature of 60° C. for heating in a water bath for 15 min. Finally, the product is sequentially placed into acetone and isopropanol for ultrasonic cleaning for 3 min, followed by washed with ultrapure water for 2 min and blown with nitrogen, so that the manufacturing of the device of the embodiment 1 is completed.

In the description of the disclosure, it should be understood that the terms "center", "longitudinal", "lateral", "length", "width", "thickness", "up", "down", "front", "back", "left", "right", "vertical", "horizontal", "top", "bottom", "inside", "outside", "clockwise", "counterclockwise" and the like indicate orientations or positional relationships are based on the orientations or positional relationships shown in the drawings, and are merely for the convenience of describing the disclosure and simplifying the description, and do not indicate or imply that the referred device or element must have a specific orientation, be constructed and operated in a specific orientation, and therefore should not be understood as limiting the disclosure.

In addition, the terms "first" and "second" are used for descriptive purposes only and should not be understood as indicating or implying relative importance or implicitly indicating the number of the indicated technical features. Therefore, the features defined as "first" and "second" may explicitly or implicitly include one or more of the features. In the description of the disclosure, the meaning of "plurality" is two or more, unless otherwise clearly and specifically defined.

In the disclosure, unless otherwise clearly specified and limited, the terms "installed", "connection", "connected", "fixed" and the like should be understood in a broad sense. For example, it can be a fixed connection, a detachable connection, or an integral connection; it can be a mechanical connection or an electrical connection; it can be a direct connection or an indirect connection through an intermediate medium, it can be the internal connection of two elements or the interaction relationship between two elements. For those skilled in the art, the specific meanings of the above terms in the disclosure can be understood according to specific circumstances.

In the disclosure, unless otherwise clearly specified and limited, a first feature being "above" or "below" a second feature may include that the first and second features are in direct contact, or may include that the first and second features are not in direct contact but are in contact through another feature between them. Moreover, a first feature being "above", "on an upper of" and "upward" a second feature includes that the first feature is directly above and obliquely above the second feature, or simply indicates that the first feature is higher in level than the second feature. A first feature being "below", "on a lower of" and "downward" a second feature includes that the first feature is directly below and obliquely below the second feature, or simply indicates that the first feature is lower in level than the second feature.

In the description of this specification, the description with reference to the terms "one embodiment", "some embodiments", "example", "specific example", or "some examples" means that the specific features, structures, materials or characteristics described in conjunction with the embodiment or example are included in at least one embodiment or example of the disclosure. In this specification, the schematic representations of the above terms do not necessarily refer to the same embodiment or example. Moreover, the specific features, structures, materials or characteristics described may be combined in any one or more embodiments or examples in a suitable manner. In addition, those skilled in the art may combine different embodiments or examples described in this specification.

The above contents are further detailed descriptions of the disclosure in combination with specific embodiments, and it cannot be determined that the specific implementation of the disclosure is limited to these descriptions. For those skilled in the art, multiple simple deductions or substitutions can be made without departing from the concept of the disclosure, which should be regarded as falling within the protection scope of the disclosure.

What is claimed is:

1. A manufacturing method of a gallium nitride (GaN)-based device based on patterned ohmic contact, comprising:
    step 1, growing a nucleation layer, a buffer layer, a channel layer, an insertion layer, a barrier layer and a cap layer on a substrate layer sequentially in that order;
    step 2, growing a silicon oxide ($SiO_2$) mask layer on the cap layer;
    step 3, coating photoresist on the $SiO_2$ mask layer, and photolithographing ohmic contact region patterns on two sides of the photoresist;
    wherein an axis of each of the ohmic contact region patterns extends along a gate width direction, and opposite edges of the ohmic contact region patterns each comprise a plurality of arc-shaped edges and a plurality of flat edges; and
    wherein the plurality of arc-shaped edges and the plurality of flat edges are alternately arranged and sequentially connected; and each of the plurality of arc-shaped edges protrudes towards outward;
    step 4, etching the $SiO_2$ mask layer, the cap layer, the barrier layer, the insertion layer and a part of the channel layer corresponding to the ohmic contact region patterns to form ohmic contact recesses, and removing the photoresist;
    step 5, epitaxially growing a n-type doped gallium nitride ($n^+$-GaN) material or the $n^+$ a n-type doped indium gallium nitride ($n^+$-InGaN) material on a surface of a product prepared in the step 4;

step 6, removing the SiO₂ mask layer to form epitaxial layers;

step 7, preparing a source electrode and a drain electrode on the epitaxial layers;

step 8, preparing a mesa isolation;

step 9, depositing a passivation layer on surfaces of the epitaxial layers and the cap layer, removing the passivation layer deposited on the source electrode and the drain electrode, and preparing a gate groove;

step 10, preparing a gate electrode; and step 11, performing metal interconnect to obtain the GaN-based device based on patterned ohmic contact; wherein the GaN-based device based on patterned ohmic contact comprises:

the substrate layer, the nucleation layer, the buffer layer, the channel layer, the insertion layer, the barrier layer and the cap layer sequentially arranged in that order from bottom to top;

the ohmic contact recesses, defined on two ends of the cap layer respectively and extending into the channel layer; wherein an axis of each of the ohmic contact recesses extends along the gate width direction;

the gate electrode, located between the ohmic contact recesses;

wherein a side wall of each of the ohmic contact recesses close to the gate electrode comprises a plurality of arc-shaped side walls and a plurality of flat side walls;

wherein the plurality of arc-shaped side walls and the plurality of flat side walls are alternately arranged and sequentially connected; and each of the plurality of arc-shaped side walls protrudes towards a direction of the gate electrode;

the epitaxial layers, disposed in the ohmic contact recesses respectively, wherein an upper end of each of the epitaxial layers is located above the cap layer; and the passivation layer, covered on the cap layer and the epitaxial layers, wherein the source electrode and the drain electrode penetrate through the passivation layer and are disposed on the epitaxial layers respectively; and the gate electrode penetrates through the passivation layer and extends onto the cap layer; and wherein the epitaxial layers are made from the $n^+$-GaN material or the $n^+$-InGaN material.

2. The manufacturing method of the GaN-based device based on patterned ohmic contact as claimed in claim 1, wherein the step 3 comprises:

coating the photoresist on the SiO₂ mask layer, exposing the ohmic contact region patterns on the two sides of the photoresist through a mask using a photolithography machine to obtain exposed ohmic contact region patterns, and developing the exposed ohmic contact region patterns to remove the photoresist on the ohmic contact region patterns.

3. The manufacturing method of the GaN-based device based on patterned ohmic contact as claimed in claim 2, wherein the step 4 comprises:

step 41, removing the SiO₂ mask layer on the ohmic contact region patterns, and etching to remove the cap layer, the barrier layer, the insertion layer and the part of the channel layer corresponding to the ohmic contact region patterns, to define the ohmic contact recesses; and step 42, removing the photoresist from a surface of a product prepared in the step 41.

4. The manufacturing method of the GaN-based device based on patterned ohmic contact as claimed in claim 1, wherein the step 7 comprises:

step 71, photolithographing a source electrode pattern and a drain electrode pattern on the epitaxial layers respectively;

step 72, evaporating titanium/gold (Ti/Au) metal electrodes through an electron beam evaporation device; and step 73, stripping metals in unexposed regions to form the source electrode and the drain electrode.

* * * * *